United States Patent [19]

Norman

[11] Patent Number: 5,437,091
[45] Date of Patent: Aug. 1, 1995

[54] HIGH CURVATURE ANTENNA FORMING PROCESS

[75] Inventor: Ronald W. Norman, Plymouth, Minn.

[73] Assignee: Honeywell Inc., Minneapolis, Minn.

[21] Appl. No.: 82,111

[22] Filed: Jun. 28, 1993

[51] Int. Cl.6 .......................................... H01P 11/00
[52] U.S. Cl. ........................................ 29/600; 29/846
[58] Field of Search .................................. 29/600, 846

[56] References Cited

U.S. PATENT DOCUMENTS

| 4,010,470 | 3/1977 | Jones, Jr. . | |
| 4,051,480 | 9/1977 | Reggia et al. . | |
| 4,078,237 | 3/1978 | Kaloi . | |
| 4,110,751 | 8/1978 | Reggia et al. . | |
| 4,738,746 | 4/1988 | Clariou .......................... | 29/846 X |
| 4,816,836 | 3/1989 | Lalezari . | |
| 4,823,145 | 4/1989 | Mayes et al. . | |
| 4,853,704 | 8/1989 | Diaz et al. . | |
| 4,931,808 | 6/1990 | Lalezari et al. . | |
| 4,937,935 | 7/1990 | Clariou .......................... | 29/846 |
| 4,944,087 | 7/1990 | Landi ............................. | 29/846 X |
| 4,980,694 | 12/1990 | Hines . | |
| 5,045,862 | 9/1991 | Alden et al. . | |

FOREIGN PATENT DOCUMENTS 3-242992 10/1991 Japan ..................................... 29/846

Primary Examiner—Carl J. Arbes
Attorney, Agent, or Firm—Craig J. Lervick

[57] ABSTRACT

A high curvature antenna is formed by using a multiple layer of laminate positioned between all microstrip elements and the conductive ground plane. By using multiple layers of laminate material, attached to one another with a thin bonding film, the antenna is easily configured in a high curvature manner. This structure and method of fabrication allows for the manufacture of a high curvature antenna having no wrinkles, kinks or discontinuities of any type in the ground plane, thus reducing defects when the antenna is produced.

15 Claims, 2 Drawing Sheets

HIGH CURVATURE ANTENNA FORMING PROCESS

BACKGROUND OF THE INVENTION

The present invention relates to microstrip antennas for use in the transmission and receipt of microwave signals. More specifically, the present invention relates to microstrip antenna structures which are configured in a curved manner so as to be conformally attached to the curved outer surface of an airframe.

Microstrip antennas are currently constructed using a single layer of metal clad plastic laminate. The laminate typically takes on a planar structure having electrically conductive metallic films on opposite surfaces thereof. Antenna radiators, matching networks, phase shifters and power dividers are formed by photochemically etching one side of the laminate. On the second side of the laminate remains a continuous metallic ground plane. This laminate is then curved or reconfigured to allow conformal attachment to the outer skin of an aircraft. A second sheet of protective plastic is then bonded to the antenna radiating surface, forming a protective radome.

The microstrip antenna structure comprises a single plastic laminate between the etched circuits and the ground plane. The thickness of this laminate is a function of the antenna frequency and bandwidth requirements.

As previously mentioned, it is necessary to curve or reconfigure the antenna structure so as to allow it to be conformally attached to the exterior surface of an airframe. Often, this requires curving the antenna structure into a very tight radius of curvature (e.g., forming a curved member having a radius of curvature as low as 2.5 inches). Typically, the forming or curving of the antenna structure is done by heating the microstrip antenna structure and pressing it into a mold.

As the laminate thickness increases, it becomes impossible to construct an antenna that will conform to a tight radius of curvature. Attempting to curve a microstrip antenna structure having a thick laminate into a very tight radius of curvature results in wrinkling or kinking of the ground plane. This wrinkling or kinking causes cracks and stresses in the ground plane, thus resulting in electrically intermittent portions. Furthermore, the wrinkling is objectionable for cosmetic reasons as it causes the part to look defective.

The kinking or wrinkling of the ground plane often necessitates scrapping or reworking the antenna. Rework or scrapping severely affects the efficiency of producing antennas, thus drastically affecting the cost of producing a conformal antenna.

Another problem with the antenna structure just described is the relaxing or straightening that results over time. The antenna is initially bent or curved to its desired radius of curvature. However, over time the antenna structure relaxes to a larger radius of curvature. This relaxation of the antenna configuration requires reworking and reforming the antenna, resulting in higher costs and higher scrap rates.

SUMMARY OF THE INVENTION

It is an object of the present invention to provide a new structure for a high curvature antenna. It is also an object of the present invention to provide a method to form the antenna into its desired configuration. This antenna structure is then capable of being conformally attached to the exterior surface of an airframe.

It is a further object of the present invention to fabricate an antenna which can be easily configured as a high curvature member without kinking or wrinkling its ground plane. Maintaining the continuity of the ground plane will assure efficient operation of antenna. Furthermore, by avoiding wrinkles or kinks, the scrap rate will be eliminated, thus lowering production costs.

It is another object of the present invention to provide a method of forming the high curvature antenna which results in a low frequency of defects. Reducing defects will again reduce the production costs of the antenna by eliminating the need to rework or scrap parts.

Additionally, it is an object of the present invention to provide an antenna structure that will maintain its high curvature configuration over time. This eliminates the need to reform the antenna prior to attachment to an aircraft. Furthermore, the antenna only needs to be formed once and will maintain its high curvature configuration throughout its life.

The antenna of the present invention utilizes a plurality of laminate layers that exist between the microstrip antenna components and the opposing ground plane. The microstrip antenna components are formed upon one surface of a single laminate. The microstrip components may include antenna radiators, matching networks, phase shifters, or power dividers. The laminate having the antenna components attached thereto is then attached to a plurality of other laminate members. Any number of layers of various thicknesses could be used, so long as the composite structure is of the desired thickness. The final layer of laminate, opposite the microstrip radiator elements, has a continuous ground plane on its outer surface. The layers of laminate are attached to one another using a bonding film. A protective layer is then placed over the top of the microstrip antenna elements, thus forming a protective radome.

The multilayer structure is then placed in a forming fixture. Heat and pressure are simultaneously applied to the planar, multilayer antenna to form the antenna structure into a high curvature configuration. The application of heat also causes the bonding film to curve, attaching the laminate layers securely to one another. The use of multiple laminate layers, attached to one another by a thin bonding film, allows the antenna to be curved to a fairly high curvature without kinking or wrinkling the ground plane.

BRIEF DESCRIPTION OF THE DRAWINGS

Further objects and advantages of the present invention can be seen by reading the following detailed description in conjunction with the drawings, in which.

DETAILED DESCRIPTION OF THE INVENTION

Figure 1:
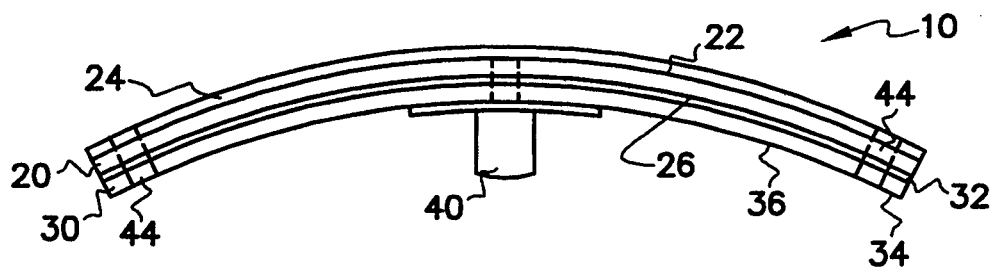
FIG. 1 is a side view of the multilayer antenna structure of the present invention.
Figure 2:
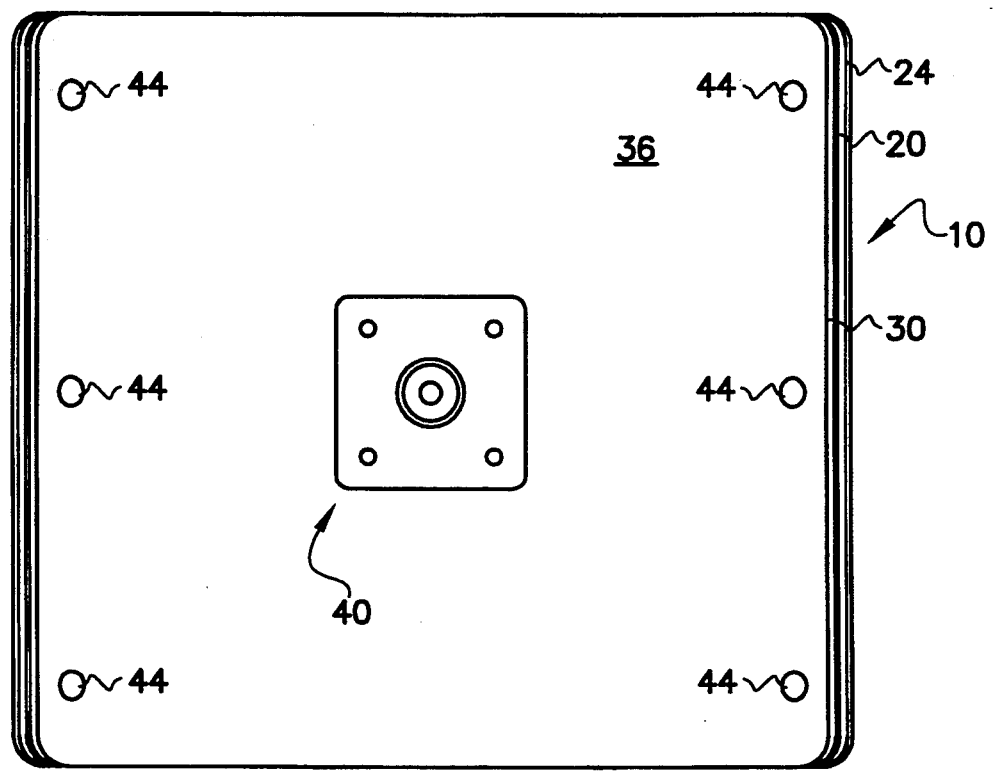
FIG. 2 is a view of the back side of the antenna structure of the present invention, showing the continuous ground plane.

The present invention provides an antenna structure capable of being formed into a high curvature configuration. Illustrated in FIG. 1 is a side view of an antenna 10 of the present invention. FIG. 2 shows a back view of antenna 10. As shown in FIG. 1, antenna 10 is curved in a semicylindrical manner so as to allow conformal attachment to the exterior surface of an airframe or aircraft (not shown).

Antenna 10, in order to allow high curvature, is made up of a plurality of layers of material. The number of layers used and the thickness of each layer will be dictated by the performance requirements of the antenna. In one embodiment of the invention two layers are used, but it will be understood that any number of layers could be used.

A first laminate layer 20 has a plurality of necessary microstrip components 18 configured on a surface 22 thereof. Microstrip components 18 are fabricated by initially putting a thin film of electrically conductive material on the entire surface 22 of laminate 20. Generally, this thin film of electrically conductive material is some type of metal, e.g., copper. In order to form microstrip components 18, appropriate patterns are etched into the conductive thin film, thus forming microstrip components 18. Those skilled in the art will recognize that the process used to fabricate microstrip components 18 upon the surface of first laminate layer 20 is very similar to that used in the fabrication of circuit boards. These microstrip structures may include antenna radiators, matching networks, phase shifters, and power dividers.

A protective plastic laminate 24 is then layered over microstrip components 18 now situated on surface 22 of first laminate layer 20. Plastic laminate 24 is a protective radome which will protect microstrip components 18. Antenna 10 has a second laminate layer 30 attached to a back surface 26 of first laminate layer 20. Second laminate 30 is attached to first laminate 20 using a bonding film 32. Upon the bottom surface 34 of second laminate layer 30 is a ground plane or backplane 36. Ground plane 36 is a continuous layer of electrically conductive material. Again, one example of material used to form this electrically conductive material is copper. A void 38 exists in ground plane 36 to allow connection of the microstrip elements to a connector 40. Connector 40 allows connection between microstrip components 18 and other signal processing electronics (not shown).

To facilitate the attachment of antenna 10 to an airframe, a plurality of mounting holes 44 are drilled through the entire antenna 10. Mounting holes 44 could be configured any number of ways to facilitate attachment to an airframe.

Figure 3:
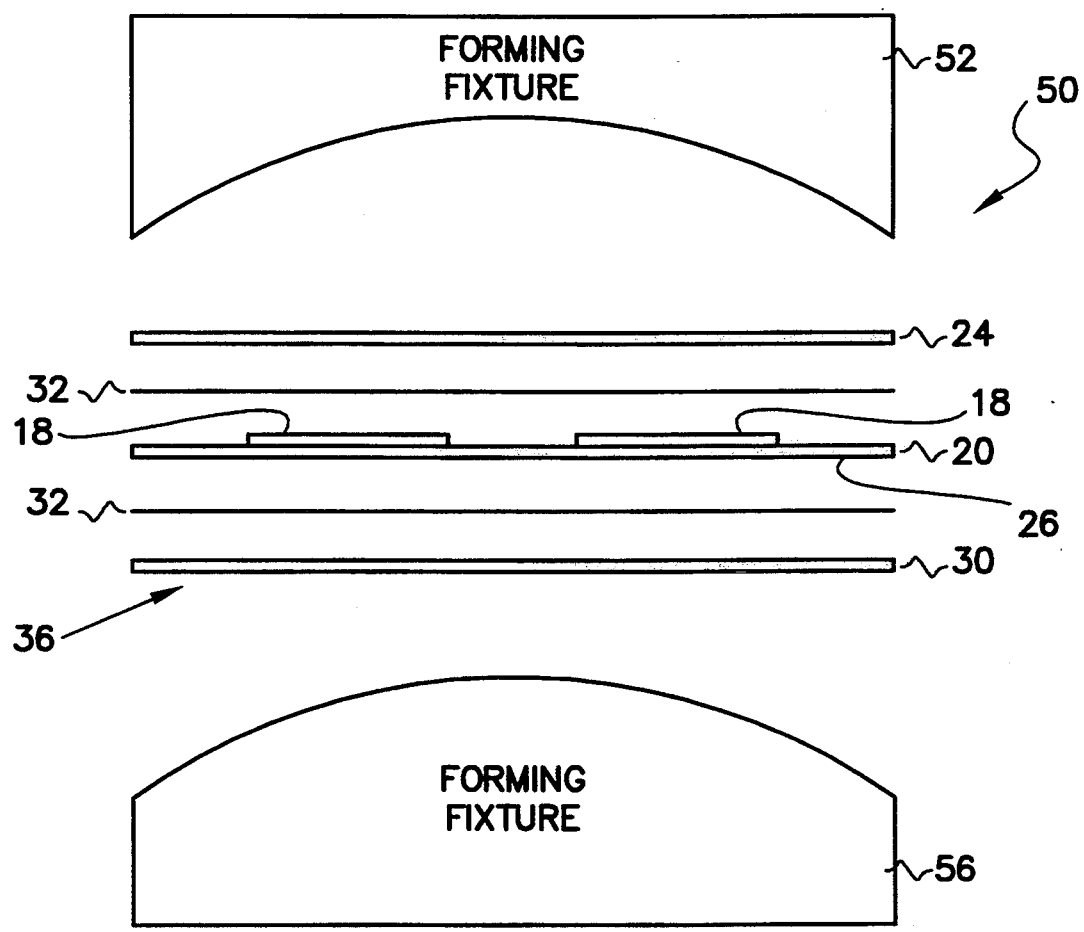
FIG. 3 is a diagram of a forming fixture for forming the antenna into its high curvature configuration.

Referring now more specifically to FIG. 3, there is shown an exploded view of antenna 10 prior to its conformal shaping. Here, first laminate layer 20 and second laminate layer 30 are shown, as well as bonding films 32 and protective radome 24. Microstrip components 18 are shown here in exaggerated size.

The multiple laminate layers, 20 and 30, of antenna 10 are assembled to form a single planar member by attaching the first laminate layer 20 and second laminate layer 30 to one another using a bonding film 32. The single planar member is then placed into a forming fixture 50 to form the necessary curvature. In one embodiment of the present invention, forming fixture 50 comprises a concave mold member 52 and a convex pressing member 56. In order to curve antenna 10 to its desired curvature, antenna 10 is placed in forming fixture 50 wherein the two members of forming fixture 50 (concave mold member 52 and convex pressing member 56) approach one another applying pressure to antenna 10. Simultaneously, heat is applied to antenna 10 to allow ease of curving or bending and to cure the bonding films 32. Antenna 10 is then curved to match the configuration of concave mold member. In this embodiment of the invention, antenna 10 is placed in forming fixture 50 so as to cause microstrip components 18 to be on the convex side thereof.

Although not shown in FIG. 3, it is understood that forming fixture 50 has the necessary facilities to accommodate connector 40 or any elements related thereto. More specifically, care must be taken to assure connections can be made between connector 40 and microstrip components 18.

Using the structure shown in FIG. 1 for antenna 10, the process of curving or bending produces an easily configurable high curvature antenna. The use of a multilayer structure for antenna 10 allows for easy bending or curvature without causing kinks and/or wrinkles to appear in ground plane 36. The elimination of these kinks or wrinkles produces a more marketable and aesthetically pleasing product. Furthermore, the elimination of kinks or wrinkles in ground plane 36 also reduces performance problems with antenna 10. The result of this process is the fabrication of a functional antenna while dramatically reducing the number of defects encountered during the production process.

As will be understood by those skilled in the art, the thickness of laminate materials placed between microstrip structures and ground plane 36 will be dictated by the performance requirements of the antenna (e.g., the bandwidth and frequency response). The performance of antenna 10 is not, however, dependent upon the laminate between microstrip components 18 and ground plane 36 being continuous. Therefore, the multilayer structure of the present invention provides the necessary dielectric isolation between microstrip components 18 and ground place 36 without detrimentally affecting the performance of antenna 10.

As antenna 10 of the present invention is formed with multiple layers of laminate having no sheer discontinuities and little internal stress, the antenna maintains its curved shape (i.e., the curvature of antenna 10 does not relax with time). This eliminates any need for reforming or rebending of antenna 10 prior to installation. Elimination of rework (reforming or rebonding) is an obvious cost and time savings.

Those skilled in the art will recognize that while two layers of laminate are shown in the present embodiment, it is possible that multiple layers of laminate could be used. For example, in one embodiment of the invention, laminate having a total thickness of approximately 0.06 inches is required. To achieve this required thickness, two layers of laminate were used, each layer being approximately 0.03 inches thick. In this example, when a tighter radius is necessary, four layers can be used, each layer being approximately 0.015 inches thick. Any appropriate combination of layers can be used to achieve the required laminate thickness. Furthermore, uniform layers of laminate are used, thus allowing the individual layers to be easily produced in the necessary quantities.

Having described the present invention in considerable detail, it should be apparent to those skilled in the art that the invention can be modified in arrangement and detail without departing from the principles of the invention. We claim all modifications coming within the scope and spirit of the following claims.

What is claimed is:

1. A process for fabricating high curvature antenna having a small radius of curvature, comprising the steps of:

forming a microstrip component upon a first laminate layer;

attaching a second laminate layer to the first laminate layer, the second laminate layer having an electrically conductive material attached to one surface thereof, the second laminate layer attached to first laminate layer opposite the microstrip component such that the electrically conductive material is opposite the first laminate layer, thus forming a multilayer antenna structure;

attaching a radome layer to the multilayer antenna structure so as to cover the microstrip component, the radome layer attached before the multilayer antenna structure is formed into the substantially semicylindrical configuration; and pressing the multilayer antenna structure into a mold while concurrently heating the multilayer antenna structure, the mold for forming the multilayer antenna structure into a substantially semicylindrical configuration.

2. The process of claim 1 wherein the first laminate layer has metal cladding on only one surface thereof.

3. The process of claim 2 wherein the microstrip component is formed by chemically etching the metal cladding of the first metal clad laminate layer into a predetermined pattern.

4. The process of claim 1 further comprising attaching a connector means to the electrically conductive material of the second laminate layer, the connector means electrically connected to the microstrip component for communicating signals to and from the microstrip component.

5. The process of claim 1 wherein the microstrip component is an antenna radiator.

6. The process of claim 1 further comprising the step of forming a second microstrip component upon the first laminate layer.

7. The process of claim 7 wherein the second microstrip component is a matching network.

8. A method for making a high curvature microwave antenna having a small radius of curvature, comprising the steps of:

assembling a multilayer planar antenna by attaching a plurality of microstrip antenna components to a plurality of planar laminate layers and a ground plane to the plurality of laminate layers all attached to one another by a bonding film and positioned in juxtaposition with one another, the plurality of microstrip antenna components being attached to the plurality of laminate layers on a first side thereof and the ground plane being attached to a second side, the first side and the second side opposite one another;

attaching a radome layer over the plurality of microstrip components;

heating the multilayer planar antenna; and bending the multilayer planar antenna into a high curvature configuration by applying pressure to the multilayer planar antenna.

9. The method of claim 8 wherein pressure is applied to the multilayer planar antenna by a forming fixture, the forming fixture having a convex member and a concave member and pressure is applied by placing the multilayer antenna between the convex member and the concave member and then having the convex member and the concave member approach one another such that a convex portion of convex member is inserted into a concave portion of concave member.

10. The method of claim 9 wherein the multilayer planar antenna is inserted into the forming fixture such that the plurality of microstrip components faces the concave portion of the concave member.

11. The method of claim 8 wherein the plurality of microstrip components are attached to the plurality of laminate layers by first placing a metal cladding upon at least one layer of laminate and chemically etching the metal cladding to form the plurality of microstrip components.

12. The method of claim 8 wherein the plurality of laminate layers includes a first laminate layer and a second laminate layer.

13. The method of claim 10 wherein the high curvature antenna is formed into a substantially semicylindrical configuration having a radius of curvature less than 10 inches.

14. The method of claim 10 wherein the high curvature antenna is formed into a substantially semicylindrical configuration having a radius of curvature less than 3 inches.

15. The method of claim 8 wherein the ground plane is copper.

* * * * *